(12) United States Patent
Yeh et al.

(10) Patent No.: US 8,332,984 B2
(45) Date of Patent: Dec. 18, 2012

(54) CLEANING APPARATUS

(75) Inventors: Tso-Hung Yeh, Taoyuan (TW); Hung-Yi Chang, Taoyuan (TW); Chih-Lung Hsiao, Taoyuan (TW); Cheng-Hsien Lin, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 1389 days.

(21) Appl. No.: 11/967,006

(22) Filed: Dec. 29, 2007

(65) Prior Publication Data
US 2009/0014031 A1    Jan. 15, 2009

(30) Foreign Application Priority Data
Jul. 13, 2007  (CN) .......................... 2007 1 0076039

(51) Int. Cl.
*B08B 1/02* (2006.01)
(52) U.S. Cl. ................. 15/97.1; 15/88.3; 134/6
(58) Field of Classification Search ............... 15/97.1; 134/15; *B08B 1/02*
See application file for complete search history.

(56) References Cited

U.S. PATENT DOCUMENTS

| | | | | |
|---|---|---|---|---|
| 5,465,447 A | * | 11/1995 | Itoh et al. ...................... | 15/88.3 |
| 2001/0052159 A1 | * | 12/2001 | Moinpour et al. ............... | 15/102 |
| 2008/0011325 A1 | * | 1/2008 | Olgado et al. .................... | 134/9 |

FOREIGN PATENT DOCUMENTS

| | | |
|---|---|---|
| TW | 545321 | 8/2003 |
| WO | 2006035624 A | 4/2006 |

* cited by examiner

*Primary Examiner* — Monica Carter
*Assistant Examiner* — Stephanie N Berry
(74) *Attorney, Agent, or Firm* — Altis Law Group, Inc.

(57) ABSTRACT

The present invention relates to a cleaning apparatus for printed circuit board. The cleaning apparatus includes a base, a clamping plate fixed to the base, at least one holding member, at least one cleaning roller, and a driving mechanism. The holding member is elastically supported on the base. The at least one cleaning roller is pivotably disposed on the at least one holding member respectively. The cleaning roller includes a cleaning layer attached to a surface of the cleaning roller. The clamping plate is opposite to and departs from the cleaning roller at a distance. The driving mechanism is coupled to the cleaning roller and configured for driving the cleaning roller to rotate. The cleaning apparatus can clean printed circuit board high efficiently.

17 Claims, 13 Drawing Sheets

CLEANING APPARATUS

BACKGROUND

1. Technical Field

The present invention relates to a cleaning apparatus, especially to a cleaning apparatus for printed circuit boards.

2. Discussion of Related Art

Recently, as the electronic appliances are becoming smaller in size and diversified in function, printed circuit boards (PCBs) widely used in such electronic appliances are required to have higher circuit density and reliability.

Usually, a chemical etching process is used for etching a conductive pattern on a copper clad laminate (CCL) as described below. First, a photoresist layer is applied on the CCL by screen printing method. Second, the CCL is driven to pass through an etching bath by a feed roller, thereby an etchant is sprayed simultaneously and evenly onto both an upper surface and a bottom surface of the CCL by a number of spray nozzles. As a result, the copper layer uncovered by the photoresist layer is etched and a conductive pattern is formed on the copper layer. In order to obtain a multilayer PCB, additional CCLs will be applied on the etched CCL and then through holes may be formed using a drilling method or laser ablation method. After that, through holes are plated a copper layer thereon. Finally, the chemical etching process is repeated so as to form conductive patterns on the outer CCLs.

Various dust or debris produced in the above mentioned method are likely to cling on the CCLs. Such dust or debris may affect the quality of the CCLs. For example, referring to FIG. 13, a piece of debris of adherence layer clings on a copper layer. The debris acts as a protective layer when the copper layer is etched. As a result, the area under the debris, which is set to be etched, is not etched. This will cause short circuit between the conductive line 13 and 14. Therefore, CCLs must be cleaned prior to perform steps such as etching on the CCLs. Accordingly, there is a desire to develop a cleaning apparatus for cleaning CCLs.

SUMMARY OF THEN INVENTION

This and other features and advantages of the present invention as well as the preferred embodiments thereof and a cleaning apparatus in accordance with the invention will become apparent from the following detailed description and the descriptions of the drawings.

In the present embodiment, a cleaning apparatus includes a base, a clamping plate fixed to the base, at least one holding member, at least one cleaning roller, and a driving mechanism. The holding member is elastically supported on the base. The at least one cleaning roller is pivotably disposed on the at least one holding member, respectively. The cleaning roller includes a cleaning layer attached to a surface of the cleaning roller. The clamping plate is opposite to and departs from the cleaning roller at a distance. The driving mechanism is coupled to the cleaning roller and configured for driving the cleaning roller to rotate.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention in which.

DETAILED DESCRIPTION OF THE PREFERRED EMBODIMENTS

Figure 1:
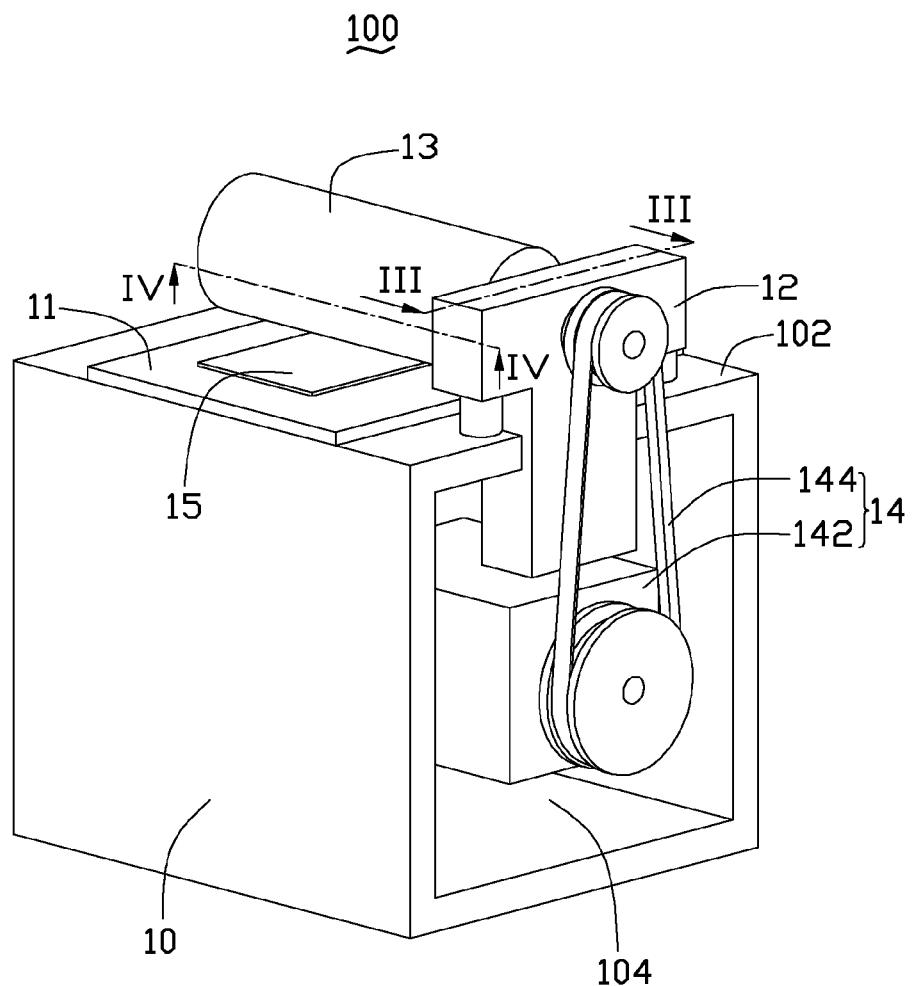
FIG. 1 is an isometric view of a cleaning apparatus in accordance with a first embodiment.

Referring to FIG. 1, a cleaning apparatus 100 in accordance with a first embodiment includes a base 10, a clamping plate 11, a holding member 12, a cleaning roller 13 and a driving mechanism 14.

Figure 2:
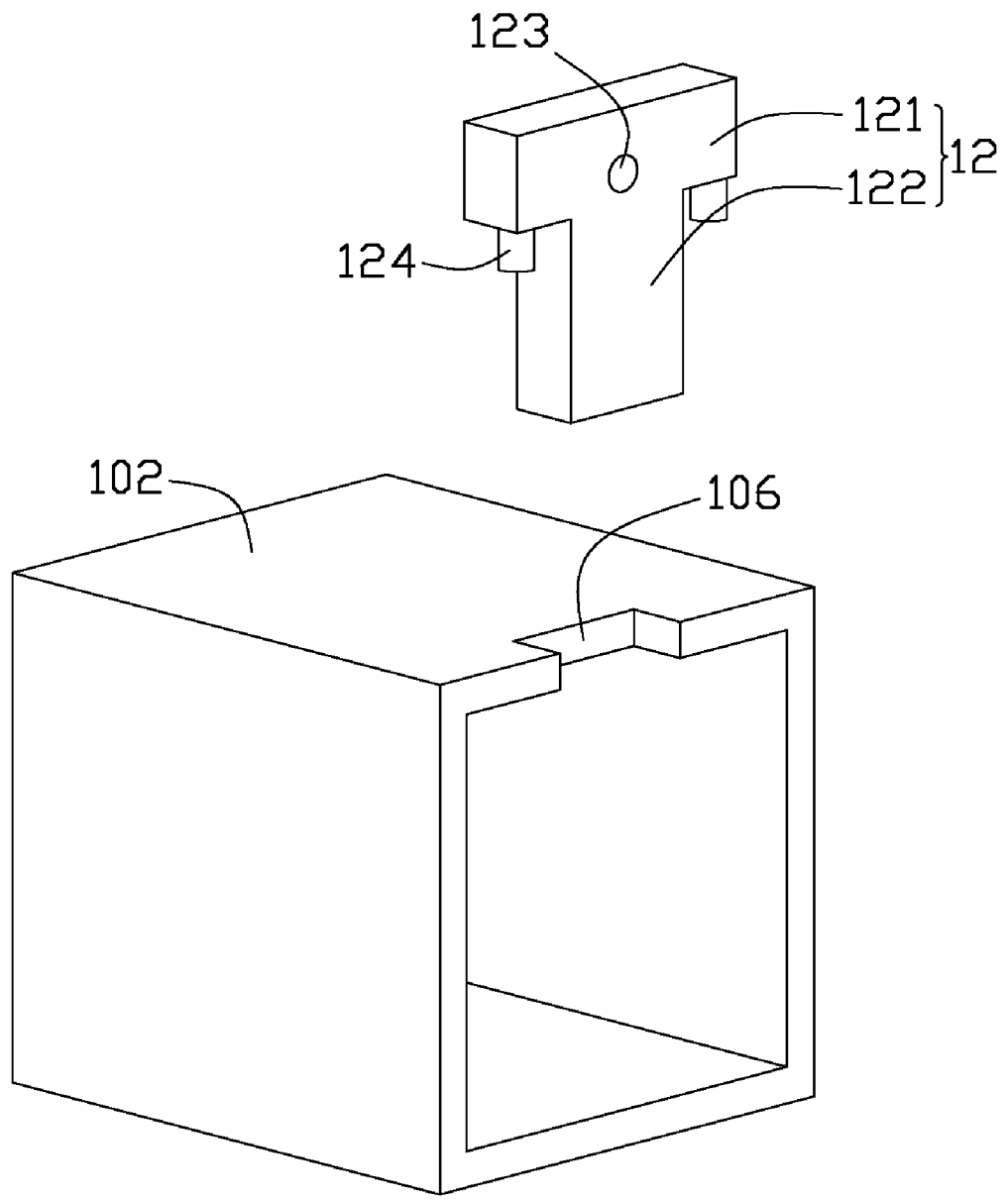
FIG. 2 is a partial cutaway exploded view of FIG. 1.
Figure 3:
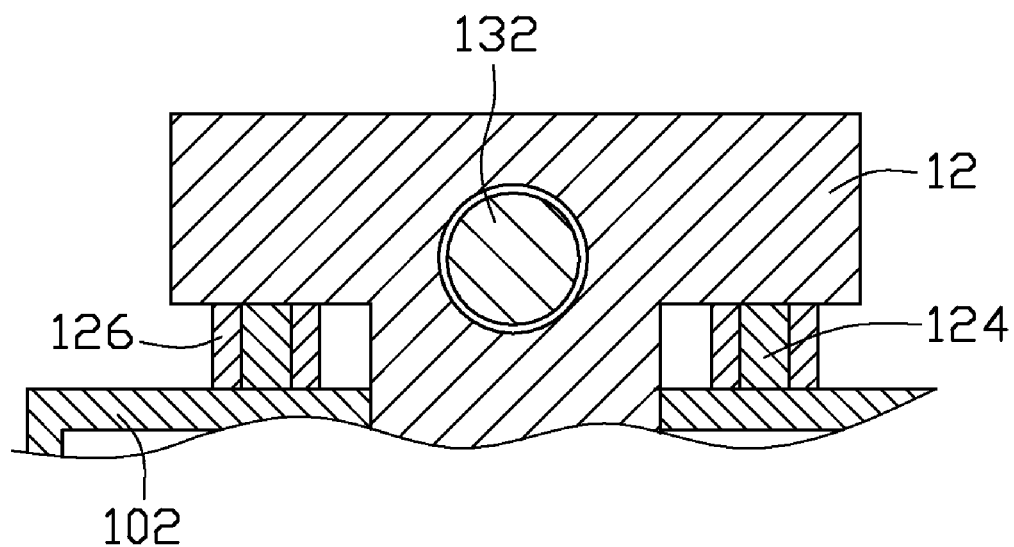
FIG. 3 is a partial cutaway cross sectional view of FIG. 1 along line III-III.

In this embodiment, the base 10 is a cuboid chest having a plain top plate 102 and a chamber 104 formed therein. Referring to FIGS. 2 and 3, a rectangle shaped opening 106 is defined in the top plate 102. The clamping plate 11 is fixed, for example, secured or adhered, to an outer surface of the top plate 102. The holding member 12 includes a holding portion 121 and a positioning portion 122 extending from the holding portion 121. A through hole 123 is formed in the holding portion 121. Two cylinder shaped supporting portions 124 extend from the holding portion 121, and the positioning portion 122 is located between the two supporting portions 124. Each supporting portions 124 has a height of H. The positioning portion 122 is configured for passing through the opening 106 such that the holding member 12 can only move in a direction perpendicular to the top plate 102. In other words, the positioning portion 122 is restricted in the opening 106.

Referring to FIG. 3, the holding portion 12 is elastically disposed on the top plate 102. Specifically, the holding portion 12 is disposed on two elastic supporting members 126. The two elastic supporting members 126 are disposed on two sides of the positioning portion 122 respectively. Elastic supporting members 126 are not limited to a special structure or type. A general criteria is that the elastic supporting members 126 can provide adequate elastic force to support the holding portion 12. Adequate elastic force means that a height of elastic supporting members 126 is larger than H when the holding portion 12 is disposed on the two elastic supporting members 126. In other words, an end of the supporting portion 124 does not contact with the top plate 102. Examples of the elastic supporting members 126 include spring and underlay made of elastic materials such as rubber. In this embodiment, the elastic supporting members 126 are cylinder shaped elastic underlays made of rubber.

Figure 4:
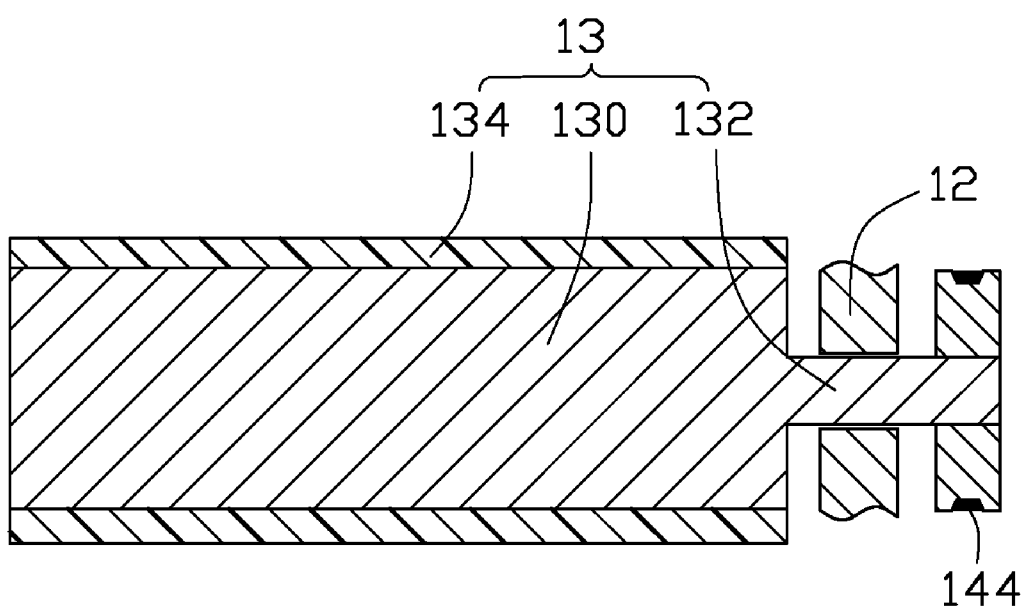
FIG. 4 is a partial cutaway cross sectional view of FIG. 1 along line IV-IV.

Referring to FIG. 4, the cleaning roller 13 includes a roller core 130, a shaft 132 extending from the roller core 130, and a cleaning layer 134 attached to a surface 136 of the roller core 130. The shaft 132 passes through the through hole 123; as a result, the cleaning roller 13 can rotate around the holding portion 12. The cleaning layer 134 is made of soft materials such as fabric and fiber. Preferably, the cleaning layer 134 further includes a cleaning solution absorbed therein. The cleaning solution can be selected form the group consisting of water, alcohol, n-propanol, isopropyl alcohol, acetone, hydrochloric acid solution, vitriol acid solution, nitric acid solution, hydrogen peroxide solution and combination thereof. In this embodiment, the cleaning roller 13 is disposed above the clamping plate 11. A printed circuit board 15 to be cleaned is disposed on a surface of the clamping plate 11; a distance between the cleaning roller 13 and the clamping plate 11 is less than a height of a printed circuit board 15. As a result, the cleaning layer 134 can tightly contact with a surface of the printed circuit board 15.

The driving mechanism 14 includes a motor 142 and a strap 144. An end of the shaft 132 is coupled to the motor through the strap 144 such that the motor 142 can drive the cleaning roller 13 to rotate.

In this embodiment, the cleaning apparatus 100 uses a motor 142 to drive a cleaning roller to clean a surface of the printed circuit board 15

Figure 5:
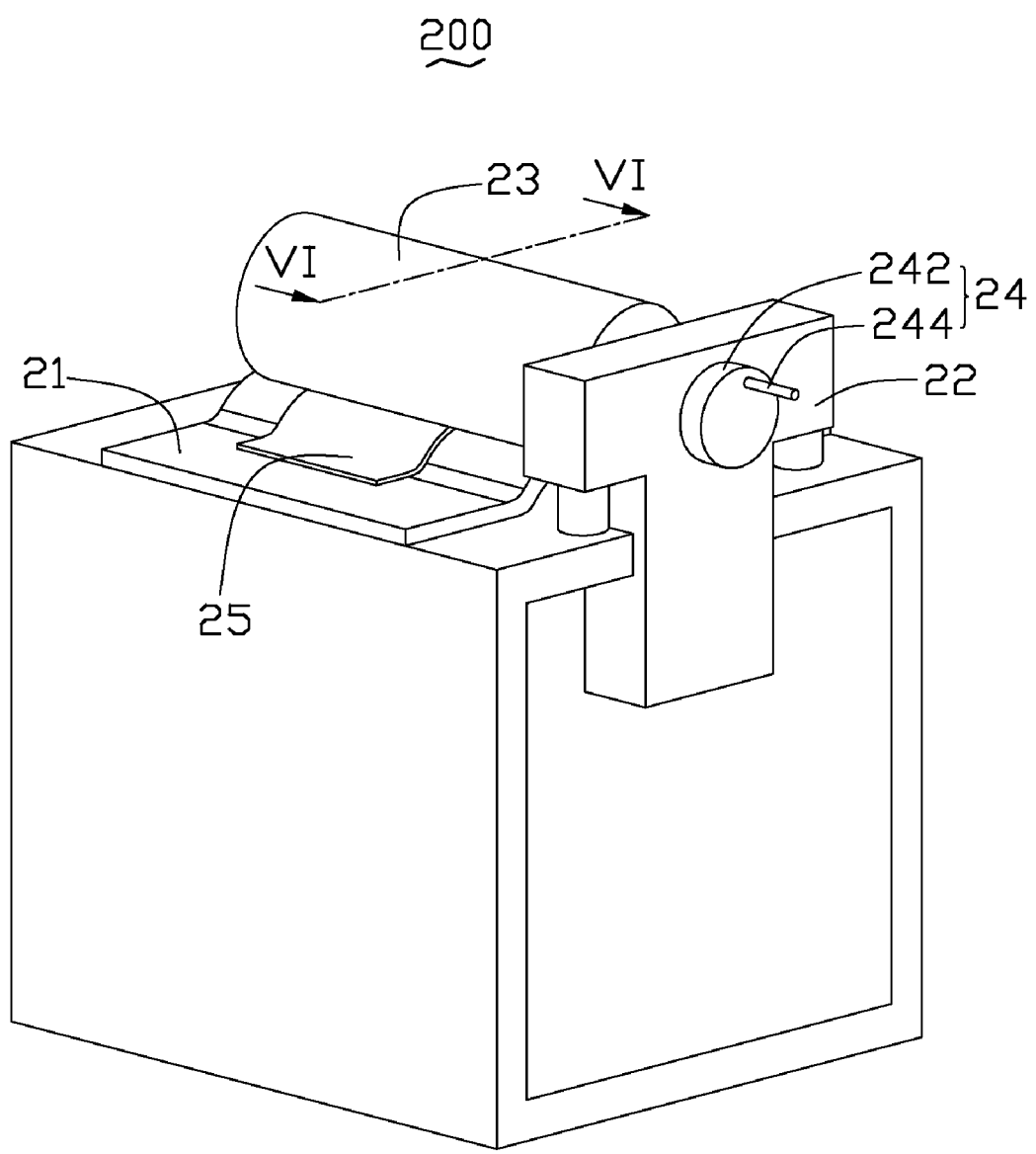
FIG. 5 is an isometric view of a cleaning apparatus in accordance with a second embodiment.
Figure 6:
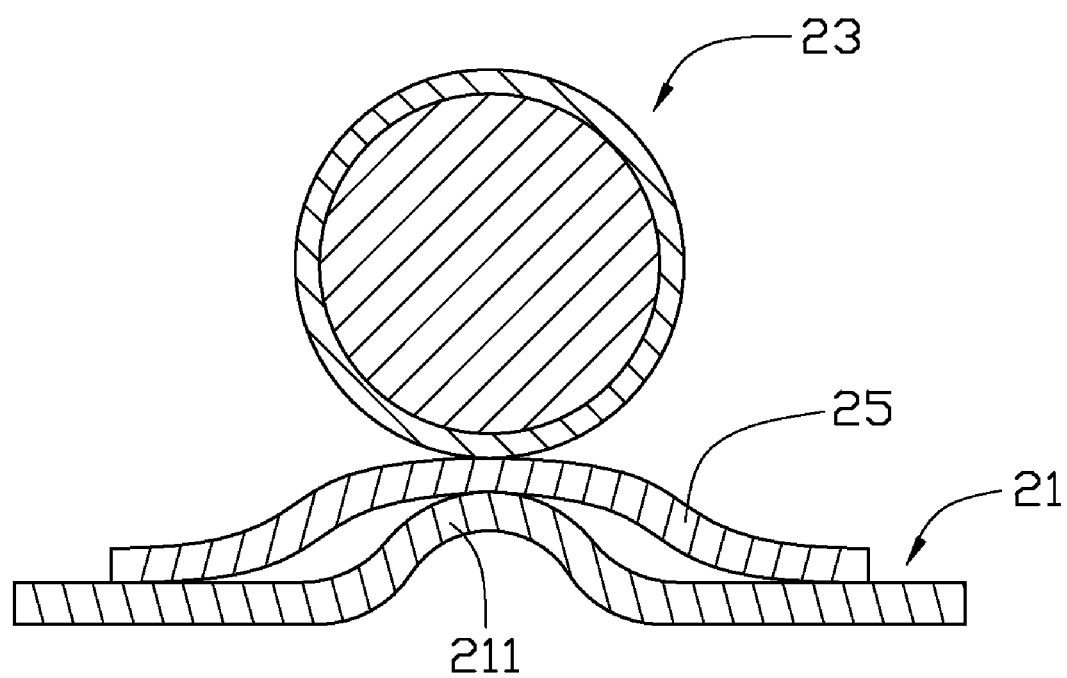
FIG. 6 is a cross sectional view of FIG. 5 along line VI-VI.

Referring to FIG. 5, a cleaning apparatus 200 in accordance with a second embodiment is similar to that of the first embodiment except the clamping board 21 and the driving mechanism 24. In this embodiment, the driving mechanism 24 includes a turnplate 242 and a handle 244. The turnplate 242 is fixed to an end of the cleaning roller 23. The handle 244 is fixed to a side of the turnplate 242. The driving mechanism 24 can be driven by an operator. Alternatively, the driving mechanism 24 can also be a crank. Referring to FIG. 6, the clamping plate 21 includes a convex portion 211 towards to the cleaning roller 23. A printed circuit board 25 is disposed on the clamping board 21; the convex portion 211 can support the printed circuit board 25 such that the printed circuit board 25 is not fully contacted with the clamping plate 21. Therefore, abrasion damage caused by the clamping plate 21 can be reduced.

Figure 7:
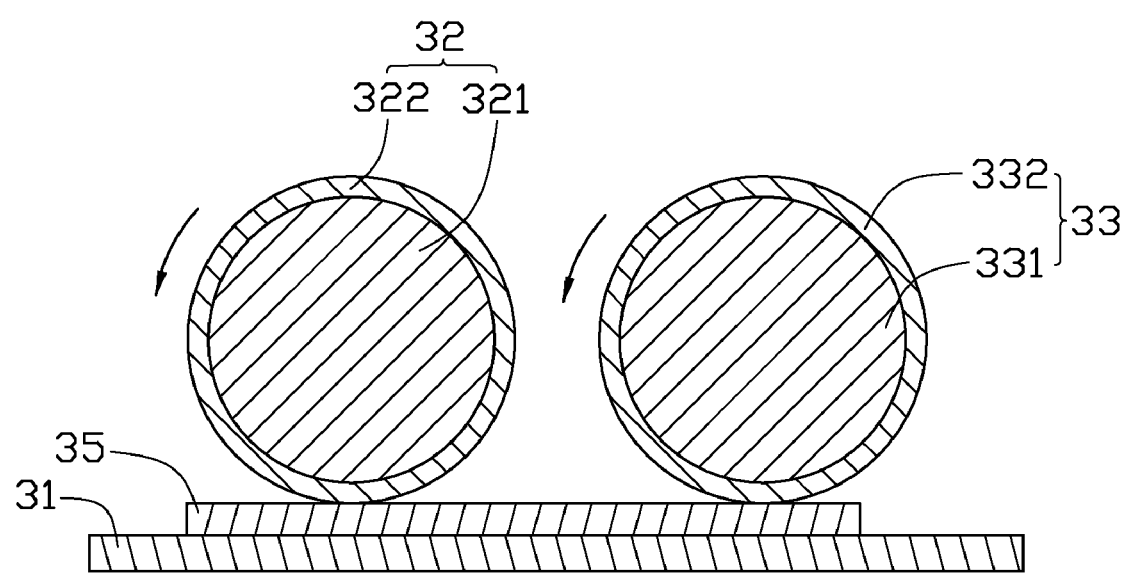
FIG. 7 is cross sectional schematic view of a cleaning apparatus in accordance with a third embodiment.

Referring to FIG. 7, a cleaning apparatus in accordance with a third embodiment is similar to that of the first embodiment except that there are two cleaning rollers 32 and 33. A first cleaning roller 32 includes a roller core 321 and a cleaning layer 322 attached to a surface of the roller core 321. A second cleaning roller 33 includes a roller core 331 and a cleaning layer 332 attached to a surface of the roller core 332. The first cleaning layer 322 includes a first cleaning solution absorbed therein. The second cleaning layer 332 includes a second cleaning solution absorbed therein. Preferably, the first cleaning solution can be resolved in the second cleaning solution. For example, the first cleaning solution can be hydrochloric acid solution and the second cleaning solution can be water.

In this embodiment, the two cleaning rollers 32 and 33 rotate in a same direction. A printed circuit board 25 to be cleaned moves in a direction from the first cleaning roller 32 to the second cleaning roller 33. A surface of the printed circuit board 25 is cleaned by the first cleaning solution of the first cleaning roller 32 at first, then the surface is cleaned by the second cleaning solution of the second cleaning roller 33, as a result, a better cleaning result can be obtained.

Figure 8:
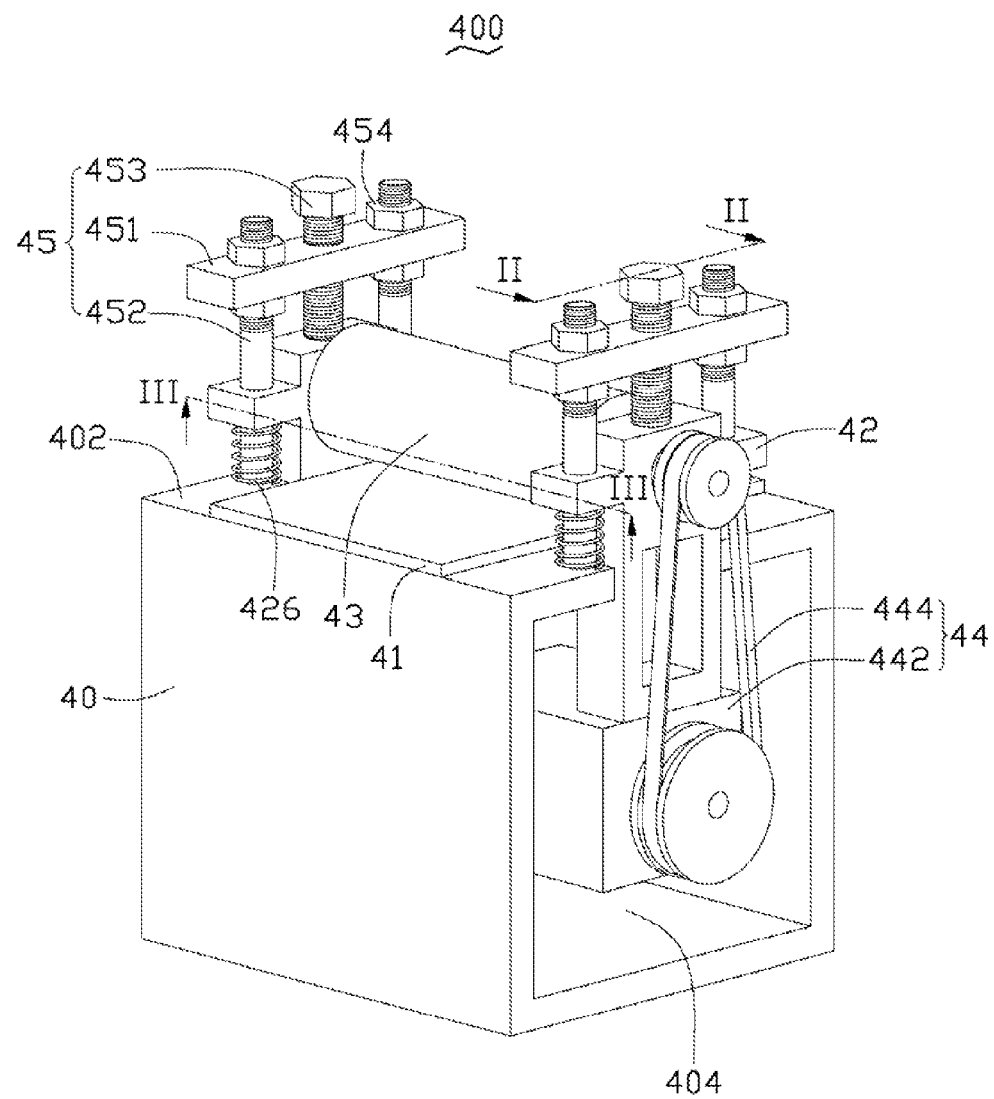
FIG. 8 is an isometric view of a cleaning apparatus in accordance with a fourth embodiment.

Referring to FIG. 8, a cleaning apparatus 100 in accordance with a fourth embodiment includes a base 40, a clamping plate 41, a holding member 42, a cleaning roller 43, a driving mechanism 44 and a regulating mechanism 45.

In this embodiment, the base 40 is a cuboid chest having a plain top plate 402 and a chamber 404 formed therein. The clamping plate 41 is fixed, for example, secured or adhered, to an outer surface of the top plate 402.

Figure 9:
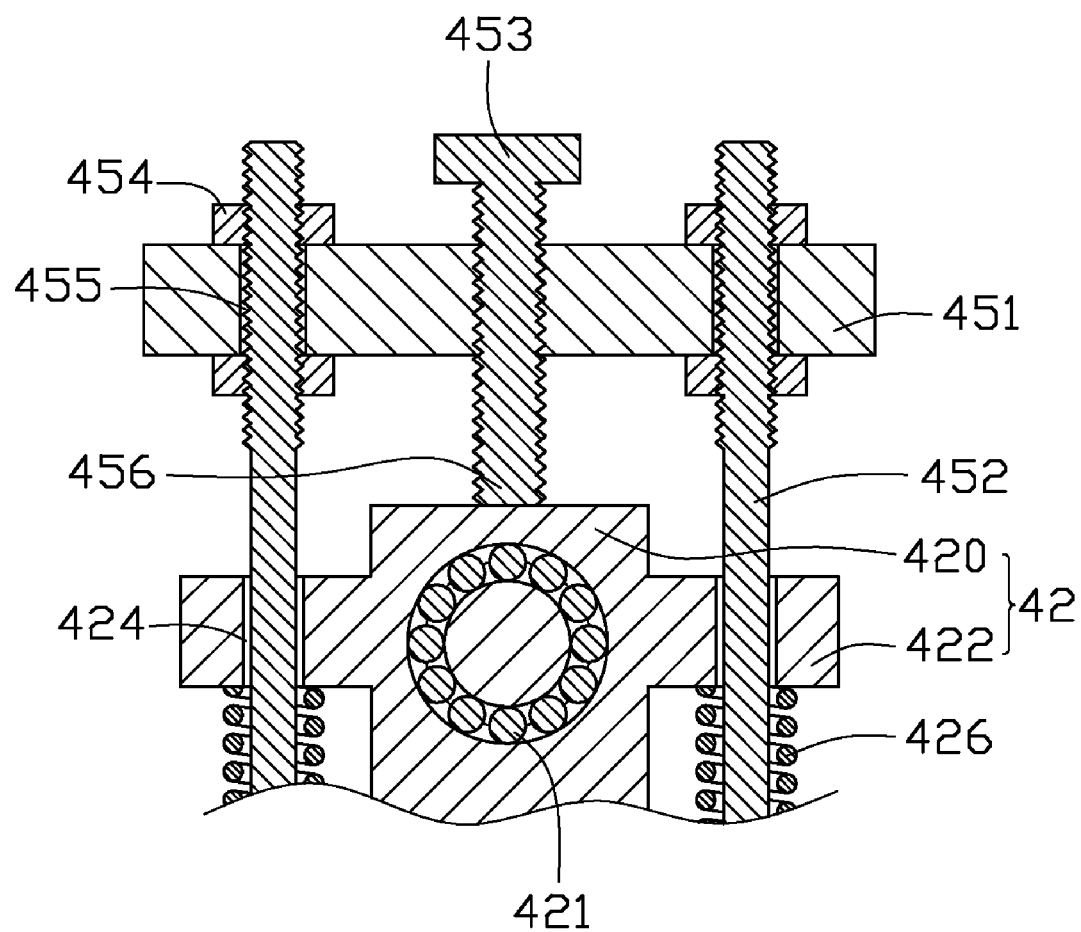
FIG. 9 is a partial cutaway cross sectional view of FIG. 8 along line IX-IX.

Referring to FIG. 9, the holding member 42 includes a main body 420 and two arms 422 extending from two opposite sides of the main body 420 respectively. The main body 420 includes a bearing 421 disposed therein. Each arm 422 has a first through hole 424 formed therein. The two first through holes 424 are parallel with each other. An elastic supporting member 426 on the base 40 supports each arm 422. In this embodiment, the elastic supporting member 426 is a spring.

Figure 10:
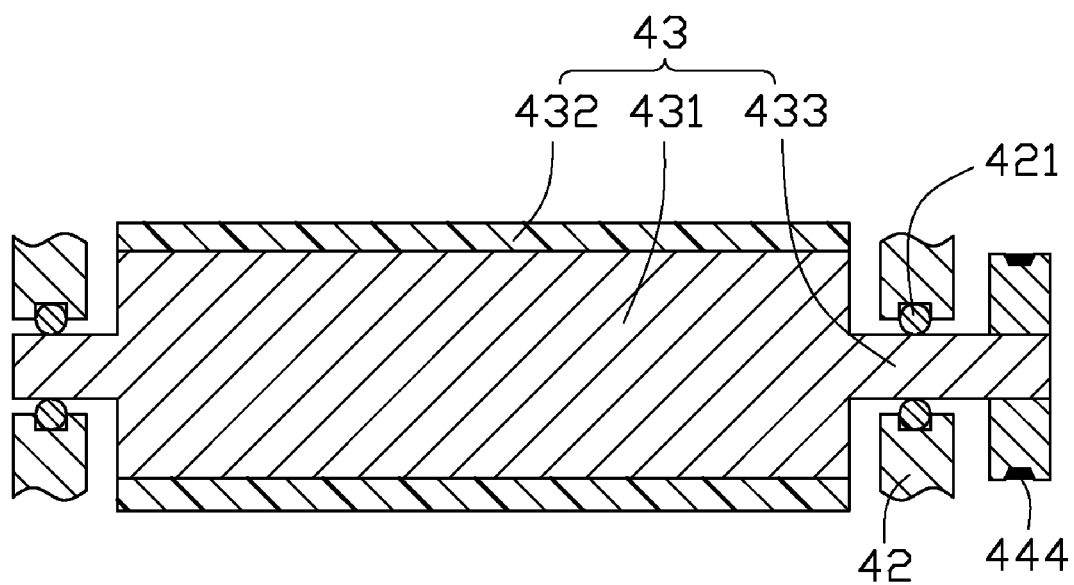
FIG. 10 is partial cutaway cross sectional view of FIG. 8 along line X-X.

Referring to FIG. 10, the cleaning roller 43 includes a roller core 431, two shafts 433 respectively extending from two opposite ends of the roller core 43, and a cleaning layer 422 attached to a surface of the roller core 43. Each shaft 433 is rotatably disposed in a corresponding holding member 42, specifically; each shaft 433 is disposed in the bearing of 421 of the holding member 42.

The driving mechanism 44 includes a motor 442 and a strap 444. An end of one of the two shafts 433 is coupled to the motor through the strap 444 such that the motor 442 can drive the cleaning roller 43 to rotate. As described in the second embodiment, the driving mechanism 44 can also be a crank.

Referring back to FIGS. 8 and 9, the regulating mechanism 45 includes a beam 451, two columns 452, and a bolt 453. The beam 451 includes two second through holes 455. Each second through hole 455 is aligned with a corresponding first through hole 424 of the arm 422. Each of the two columns 452 is fixed on the top plate 402 and extends through a corresponding first through hole 424 of the arm 422 and a corresponding second through hole 455 of the beam 451. Preferably, each column 452 also extends through a corresponding elastic supporting member 426.

Two ends of the beam 451 are secured on the two columns respectively. In this embodiment, each end of the beam 451 is secured with two nuts 454. Therefore, a height of the beam 451 can be adjusted. The bolt 453 is threadingly engaged with the beam 451 and an end 456 of the bolt 453 is in tightly contact with the main body 420 of the holding member 42. Preferably, the end 456 is in contact with a central portion of the main body 420. In this embodiment, if the bolt 453 is further screwed, the end 456 of the bolt 453 will apply a pressure to the main body 420 of the holding member, as a result, the holding member 42 will move to the top plate 402.

Figure 11:
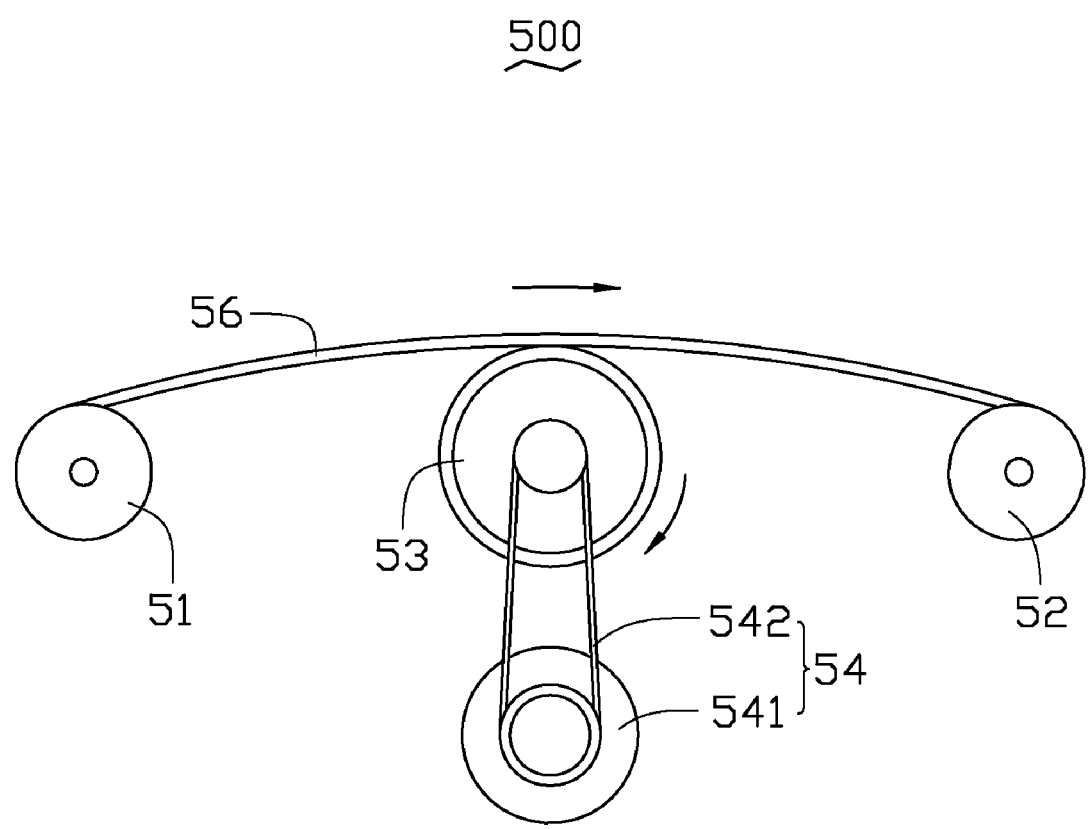
FIG. 11 is a schematic view of a cleaning apparatus in accordance with a fifth embodiment.

Referring to FIG. 11, a cleaning apparatus 500 in accordance with a fifth embodiment includes a feed roller 51, a gathering roller 52, a cleaning roller 53, and a driving mechanism 54. The driving mechanism 54 includes a motor 541 and a strap 542. The driving mechanism 54 is configured for driving the cleaning roller 53 to rotate. A printed circuit board 56 to be cleaned is rolled on the feed roller 51. The feed roller 51 provides printed circuit board 56 to the cleaning roller 53. The cleaning roller 53 cleans the printed circuit board 56; and the cleaned printed circuit board 56 is rolled on the gathering roller 52. The feed roller 51 and the gathering roller 52 can also be connected with a driving mechanism such as a motor. FIG. 11 only shows a schematic view, however, the detail structure of the cleaning roller 53 and driving mechanism 54 can be learned from above embodiments.

Figure 12:
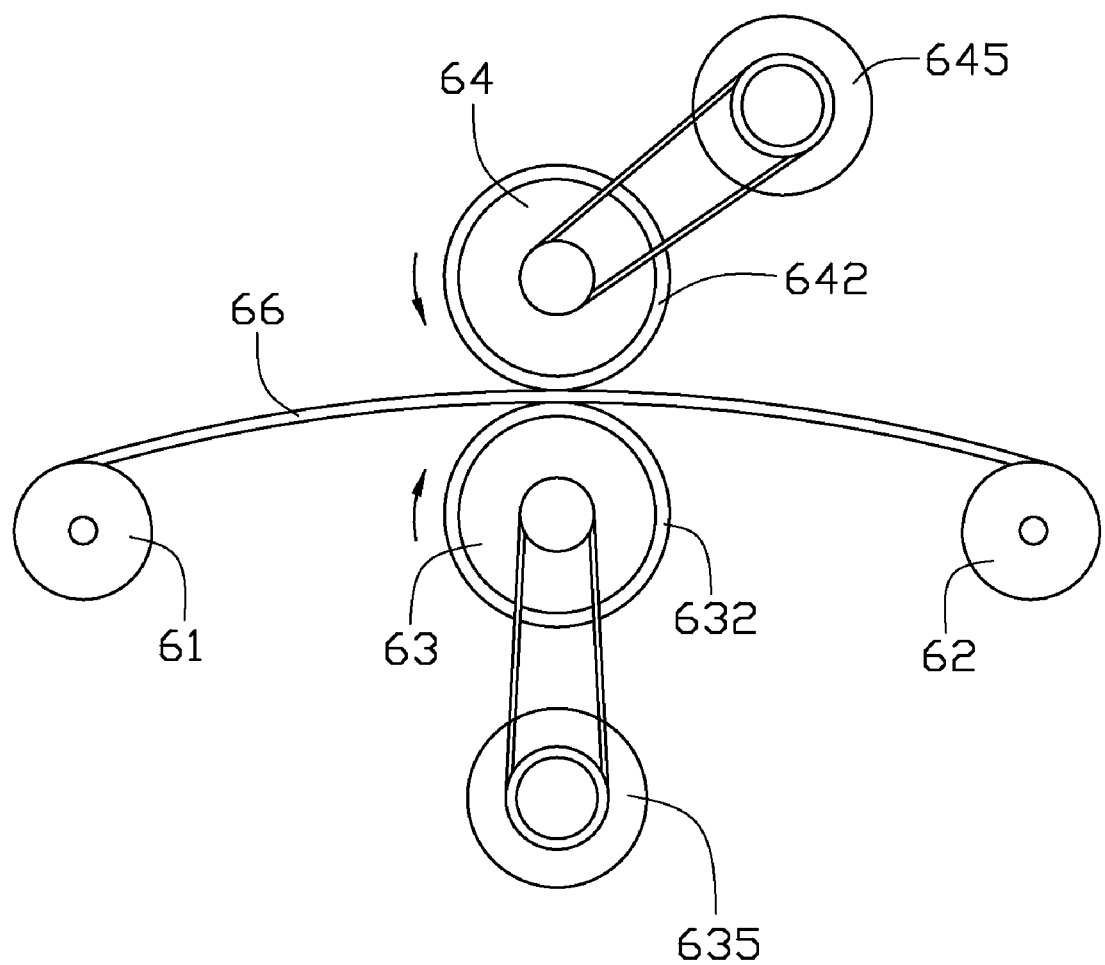
FIG. 12 is a schematic view of a cleaning apparatus in accordance with a sixth embodiment.
Figure 13:
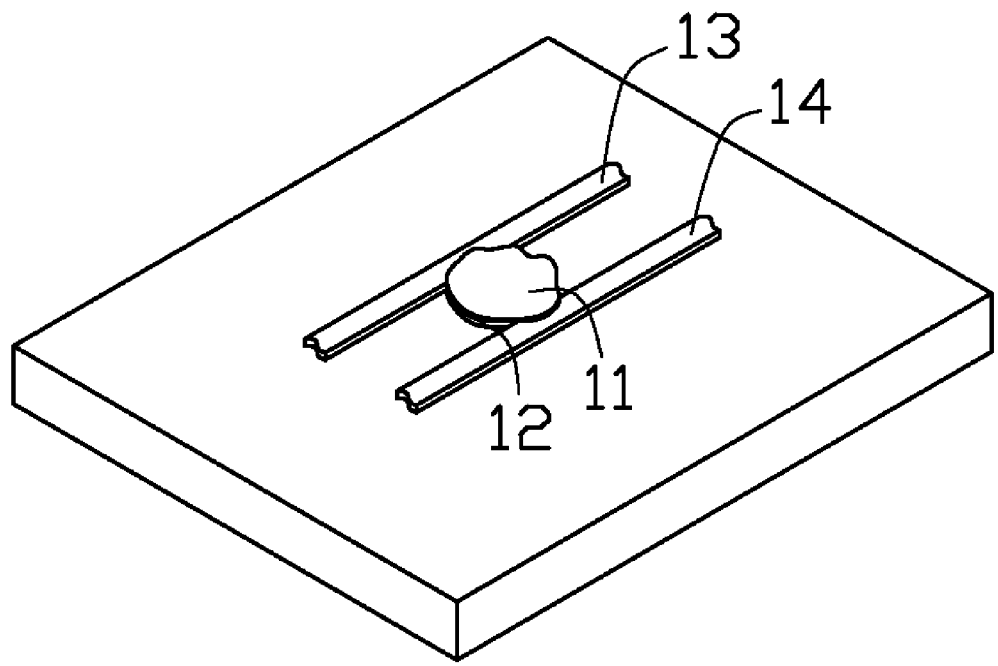
FIG. 13 is a schematic view of a printed circuit board to be cleaned.

Referring to FIG. 12, a cleaning apparatus 600 in accordance with a sixth embodiment is similar to that of the fifth embodiment except that there are two cleaning rollers 63 and 64. In this embodiment, a first cleaning roller 63 includes a first cleaning layer 632; a second cleaning roller 64 includes a second cleaning layer 642. The first cleaning layer 632 and the second cleaning layer 642 can clean two opposite surfaces of a printed circuit board 66 simultaneously. Furthermore, the first cleaning layer 632 and the second cleaning layer 642 can absorb different cleaning solution. For example, the first cleaning layer 632 absorbs a cleaning solution suitable for a dielectric surface of the printed circuit board 66, such as actone, isopropanol alcohol; and the second cleaning layer 642 absorbs a cleaning solution suitable for a copper surface of the printed circuit board 66, such as hydrochloric acid solution, vitriol acid solution, nitric acid solution and hydrogen peroxide solution.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A cleaning apparatus, comprising: a base, a clamping plate fixed to the base, at least one holding member elastically supported on the base, a first cleaning roller pivotably disposed on the at least one holding member, and a driving mechanism; the first cleaning roller comprising a roller core, at least a shaft extending from at least one end of the roller core, and a cleaning layer attached to a surface of the roller core, the clamping plate being opposite to and spaced from the first cleaning roller a distance, the driving mechanism being coupled to the first cleaning roller and configured for driving the first cleaning roller to rotate, wherein the cleaning apparatus further comprises a regulating mechanism configured for regulating a distance between the first cleaning roller and the clamping plate, the regulating mechanism comprises two columns fixed on the base, a beam fixed on the two columns, and a bolt threadedly engaged with the beam, and an end of the bolt is in contact with the holding member, the holding member comprises a main body and two arms extending from two opposite sides of the main body respectively, each arm defines a first through hole, and is supported on an elastic supporting member on the base, the beam defines two second through holes, each second through hole is aligned with a corresponding first through hole, and each of the two columns is fixed on the base and extends through a corresponding first through hole and a corresponding second through hole.

2. The cleaning apparatus as claimed in claim 1, wherein the driving mechanism is a crank.

3. The cleaning apparatus as claimed in claim 1, wherein the holding member comprises a holding portion and a positioning portion extending from the holding portion, the base comprising a top plate, the top plate comprising an opening formed therein, the positioning portion passing through the opening.

4. The cleaning apparatus as claimed in claim 3, wherein two supporting portions extend from the holding portion and towards to the top plate, and the positioning portion is located between the two supporting portions.

5. The cleaning apparatus as claimed in claim 4, wherein each holding portion is supported on an elastic supporting member.

6. The cleaning apparatus as claimed in claim 5, wherein the elastic supporting member is an underlay made of elastic materials.

7. The cleaning apparatus as claimed in claim 6, wherein the underlay is cylinder shaped.

8. The cleaning apparatus as claimed in claim 4, wherein the driving mechanism includes a motor and a strap, and the first cleaning roller is coupled to the motor through the strap.

9. The cleaning apparatus as claimed in claim 4, wherein the clamping plate includes a convex portion towards the first cleaning roller.

10. The cleaning apparatus as claimed in claim 4, wherein each supporting portion is disposed in a corresponding elastic supporting member.

11. The cleaning apparatus as claimed in claim 4, wherein the holding portion defines a through hole, and the shaft is pivotably disposed in the through hole of the holding portion.

12. The cleaning apparatus as claimed in claim 4, wherein the cleaning layer is made of a material selected from the group consisting of cloth, fibers, dust cloth, and antistatic dust cloth.

13. The cleaning apparatus as claimed in claim 12, wherein the cleaning layer comprises a cleaning solution absorbed therein.

14. The cleaning apparatus as claimed in claim 13, wherein the cleaning solution is selected from the group consisting of water, alcohol, n-propanol, isopropyl alcohol, acetone, hydrochloric acid solution, vitriol acid solution, nitric acid solution, and hydrogen peroxide solution.

15. The cleaning apparatus as claimed in claim 4, further comprising a second cleaning roller, the second cleaning roller comprising a cleaning layer, and the two cleaning layers of the first and second cleaning rollers having two different cleaning solutions absorbed therein, respectively.

16. The cleaning apparatus as claimed in claim 1, wherein the main body further comprises at least one bearing disposed therein, and the shaft is rotatably disposed in the at least one bearing.

17. The cleaning apparatus as claimed in claim 16, wherein the clamping plate includes a convex portion facing towards the first cleaning roller.

* * * * *